United States Patent [19]
Cash, Jr.

[11] Patent Number: 6,049,588
[45] Date of Patent: Apr. 11, 2000

[54] X-RAY COLLIMATOR FOR LITHOGRAPHY

[75] Inventor: Webster C. Cash, Jr., Boulder, Colo.

[73] Assignee: Focused X-Rays, Boulder, Colo.

[21] Appl. No.: 09/113,487

[22] Filed: Jul. 10, 1998

Related U.S. Application Data

[60] Provisional application No. 60/052,106, Jul. 10, 1997.
[51] Int. Cl.[7] ....................................................... G21K 1/06
[52] U.S. Cl. .................. 378/85; 378/34; 378/84; 378/147
[58] Field of Search .................. 378/84, 85, 34, 378/147, 149

[56] References Cited

U.S. PATENT DOCUMENTS

| | | | |
|---|---|---|---|
| 4,242,588 | 12/1980 | Silk et al. ................................. | 378/34 |
| 4,429,953 | 2/1984 | Zehnpfennig et al. ................. | 359/846 |
| 5,146,482 | 9/1992 | Hoover ..................................... | 378/43 |
| 5,356,662 | 10/1994 | Early et al. .............................. | 427/140 |
| 5,461,657 | 10/1995 | Hayashida et al. ....................... | 378/84 |
| 5,604,782 | 2/1997 | Cash, Jr. . | |
| 5,911,858 | 6/1999 | Ruffner ................................ | 204/192.27 |

*Primary Examiner*—David P. Porta
*Assistant Examiner*—Allen C. Ho
*Attorney, Agent, or Firm*—Dorr, Carson, Sloan & Birney, P.C.

[57] ABSTRACT

An x-ray collimator for use primarily in x-ray lithography for semiconductor fabrication provides a multi-channel collimator to produce a series of collimated beams from an x-ray source. Each channel in the array gathers photons from a small solid angle of the x-ray source and employs at least two pairs of orthogonal spherical mirrors in grazing incidence to produce a collimated beam. An array of flat mirrors steer the collimated beams into a slightly converging geometry. A beam assembler then combines the beams to create a single, large collimated beam that can be used to expose the die.

14 Claims, 11 Drawing Sheets

X-RAY COLLIMATOR FOR LITHOGRAPHY

RELATED APPLICATION

The present application is based on the Applicant's U.S. Provisional Patent Application 60/052,106, entitled "X-Ray Collimator For Lithography," filed on Jul. 10, 1997.

BACKGROUND OF THE INVENTION

1. Field of the Invention

The present invention relates generally to the field of x-ray collimators. More specifically, the present invention discloses an x-ray collimator for use primarily in x-ray lithography for semiconductor fabrication.

2. Statement of the Problem

X-ray lithography has been used experimentally in the past for etching semiconductor wafers. However, existing x-ray lithography systems have not been commercially viable due to a number of significant shortcomings, particularly the speed, cost, complexity, and size of such x-ray lithography systems.

For success in a commercial environment, an x-ray lithography system should be able to meet stringent collimation requirements. The x-ray collimator should reduce global divergence to remove all pattern shadowing in the resist, i.e., approximately 3 milli-radians over a 26 mm square mask. Local beam divergence should be reduced to below the level of diffraction in the mask features, i.e., approximately 5 milli-radians. Beam uniformity should be within ±5% to 10% across a 26 mm square wafer. The x-ray collimator must also meet gain requirements assuming a 100 watts/ster pinch source to deliver a beam with sufficient flux to support a production rate of 25 to 50 wafers per hour. In addition, the collimator optics must be robust and reliable. The x-ray collimator should not significantly increase the overall cost of the stepper, and should not have excessive space requirements.

The gain requirement is driven by the need for adequately fast systems. If speed were not the driving consideration, then the source could simply be moved back to four or five meters from the mask and meet the divergence criterion. The purpose of the collimator is to provide the low divergence with adequate signal. The speed of the stepper is controlled by the wafer handling time, the step and align time per die, and the exposure time per die. A conventional stepper uses 22 seconds to insert and remove a wafer. It also requires one second per die to step and align. Assuming a typical number of 40 dice per wafer, we can then write an expression for the number of wafers per hour achievable:

$$W = \frac{3600}{22 + 40a + 40e}$$

where W is the wafers per hour, a is the step and align time in seconds, and e is the exposure time in seconds. Since a is known to be one second, the system would handle 58 wafers per hour with an exposure time of zero. The table below shows the expected system throughput as a function of the exposure time:

| Exposure (sec) | Wafers/hr | Beam (W) |
|---|---|---|
| 0 | 58 | ∞ |
| .25 | 50 | .62 |
| 1 | 35 | .155 |
| 1.5 | 29 | .1 |
| 2 | 25 | .077 |
| 3 | 20 | .05 |
| 4 | 16 | .04 |
| 5 | 14 | .031 |
| 6 | 12 | .026 |
| 7 | 10 | .022 |

To achieve 10 wafers per hour requires 7 second exposures, 20 wafers per hour requires 3 second exposures, and 30 wafers per hour requires 1.5 second exposures.

To convert exposure time to beam intensity we must assume a resist sensitivity. As sensitivity is a function of wavelength, we must choose a number that is representative of the speed after convolution with the incident spectrum. For our purposes, an exposure of 23 mJ/cm² is reasonable, representing a balance between the 15 mJ/cm² at 14 Å and the slower response in the 11 to 8 Å band. It will thus require 155 mJ to expose a 26 mm square. These numbers have been used to generate the third column of the table above.

Inspection of the above table gives some sense of the beam requirements for an x-ray collimator. First, there is no sense in pushing much above one Watt in the collimated beam, because the exposure time has already dropped to a negligible fraction of the time spent on each die. Similarly, a beam with less than about 20 mW will yield below 10 wafers an hour and render the stepper commercially non-viable unless it is quite inexpensive. The present collimator has been designed around these numbers.

A basic tenet of optics is the principle of conservation of brightness. No passive optical system can increase the brightness of a beam, where brightness is defined to be the number of photons per area per solid angle per second. As it turns out, for the pinch source, the brightness of the source is the limiting factor on the beam that can be created. A conventional pinch source generates 100 Watts per steradian of x-rays. These emanate from an area 0.5 mm across, so the source brightness is 400 Watts/mm²/s. If the goal is to achieve one watt over a 26 mm square, with no more than 2 milli-radians of divergence, the minimum required brightness is:

$$B\text{min} = \frac{1W}{(26\text{mm})^2 \times (.002\,\text{rad})^2} = 370W/\text{mm}^2/ster$$

Which is the brightness provided by the source. The beam requirement can be relaxed in either power or divergence, or some combination of both. One Watt is achievable, but requires a very efficient collimator. If the collimator has 50% losses, then 0.5 watts is the best possible beam with 2 milli-radians of divergence. If full beam fluxes of one watt or more are to be achieved, then the source must be improved. This can happen either by increasing the x-ray flux (without increasing the size of the emitting spot), or decreasing the emitting spot size without decreasing the emitted flux. For example, in order to achieve 10 Watts and 2 milli-radians, the size of the emitting spot must be held to a stable 0.1 mm. In order to achieve 2 watts and 2 milli-radians, the spot size must be reduced to no more than 0.25 mm. However, the performance level asked of the beam does not reach this until steppers in the 50 to 100 wafer/hour range are required.

The central problem in collimator design is one of angles. Consider that to achieve one Watt in the beam, 1% of the steradian output of the source must be gathered, even if the collimator is 100% efficient. To capture one watt requires an open angle into the beam of 6° width. At the extremes of the entrance cone, the x-rays must be bent through at least 3 degrees. With collimator efficiency included, this grows to at least 5 degrees. To reach upwards to 10 Watts, then involves angles of 15 to 20 degrees. X-rays simply don't bend through such large angles without multiple reflections. These reflections can be in the form of constructive interference from multiple layers, as in crystals and multi-layers, or can be from sequential grazing incidence reflections. This means that the collimator will have either a low efficiency normal incidence reflection, or a series of reflections through co-aligned channels at grazing incidence.

3. Solution to the Problem

None of the prior art show a collimator for use in x-ray lithography that meets all of the conditions for commercially viable in terms of speed, cost, complexity, size, throughput, and collimation tolerances for an x-ray lithography systems. In contrast, the present system is able to meet these stringent requirement using pairs of orthogonal, spherical mirrors in grazing incidence, coupled with flat mirrors at grazing incidence.

SUMMARY OF THE INVENTION

This invention provides an x-ray collimator for use primarily in x-ray lithography for semiconductor fabrication. A multi-channel collimator is used to produce a series of collimated beams from an x-ray source. Each channel in the array gathers photons from a small solid angle of the x-ray source and employs at least two pairs of orthogonal spherical mirrors in grazing incidence to produce a collimated beam. An array of flat mirrors steer the collimated beams into a slightly converging geometry. A beam assembler then combines the beams to create a single, large collimated beam that can be used to expose the die.

BRIEF DESCRIPTION OF THE DRAWINGS

The present invention can be more readily understood in conjunction with the accompanying drawings, in which.

DETAILED DESCRIPTION OF THE INVENTION

Figure 1:
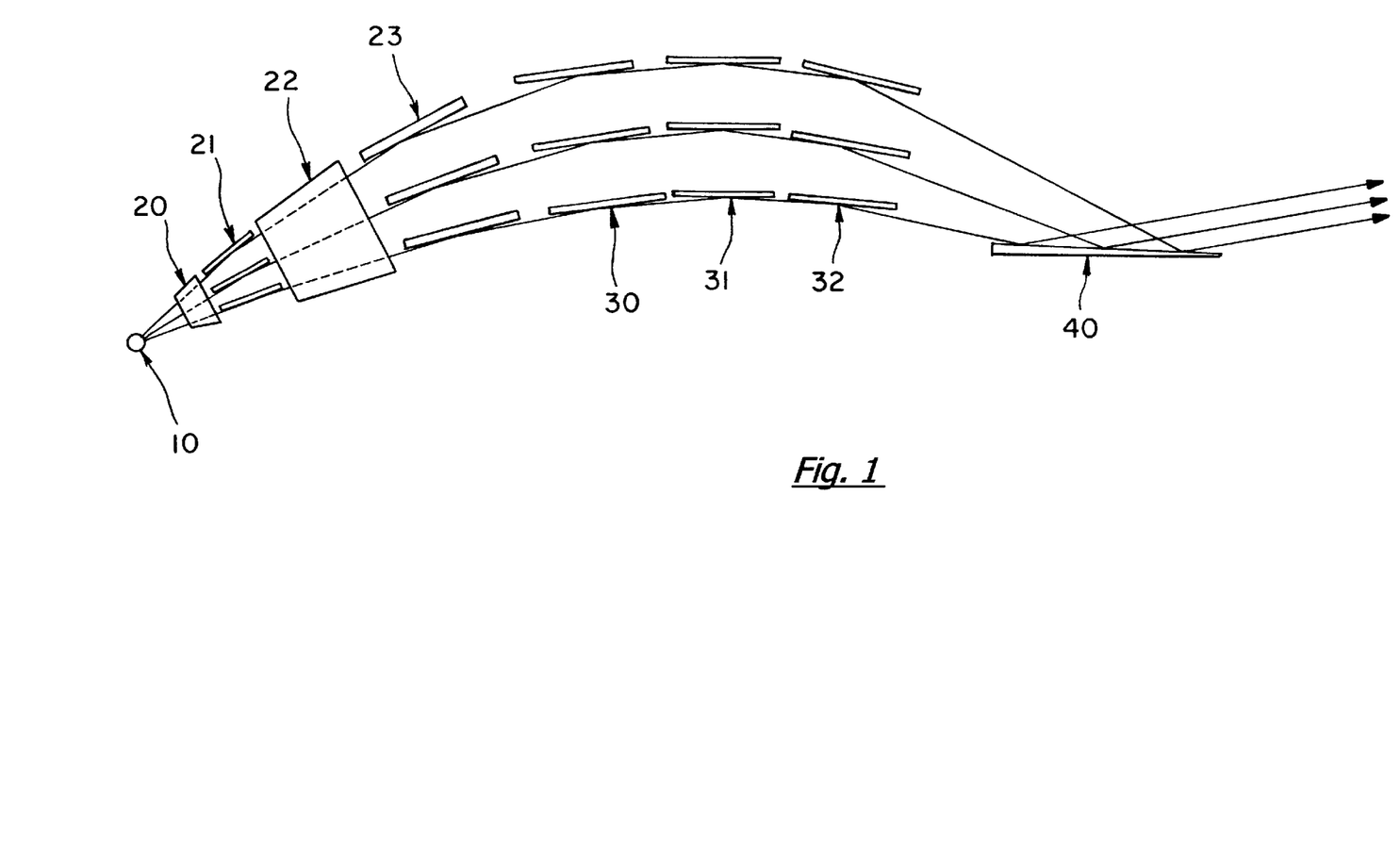
FIG. 1 is a simplified side view of the entire collimator assembly.

Turning to FIG. 1, the preferred embodiment of the present invention consists generally of three stages. The first stage is a multi-channel collimator 20–23 that receives x-ray radiation from a source 10. It has a multi-channel design that employs a stacked array of independent collimators. Each channel gathers photons from a small solid angle of the source 10 and produces a collimated beam. However, we also need to assemble the beams from the separate collimators into a single large collimated beam. The second stage is an array of flat mirrors 30–32 that steer the collimated beams from the first stage into a slightly converging geometry. The third stage is a beam assembler 40 that combines the beams from the second stage 30–32 to create a single collimated beam that can be use to expose the die. These three stages are discussed greater detail below.

Multi-Channel Collimator. In the preferred embodiment, a series of orthogonal pairs of spherical mirrors 20, 21 and 22, 23 are used for collimation. At least two pairs of spherical mirrors at grazing incidence are used to provide the required collimation. The spherical surface of the mirror provides collimation in one dimension. A second orthogonal spherical mirror provides the second dimension of collimation. The reflective surface of each mirror is actually the inner surface of a sphere having a relatively large radius. Thus, the curvature of the spherical mirrors is not physically apparent in FIGS. 1 and 2. Spherical surfaces were chosen for two reasons. First, the class of Kirkpatrick-Baez optics turns out to be very versatile, while Wolter optics are overly constraining and difficult to work with. Second, the spheres are inexpensive, easy to procure, and provide superior quality.

The removal of coma as an aberration is not particularly important for controlling the divergence of the beam, however, coma reflects a change in effective focal length across the optic which translates into a change of beam density across the collimated beam. The second spherical surface removes most of this, creating a uniform collimated beam. If desired, the present invention can be designed with coma-corrected mirrors using the methodology disclosed in the Applicant's U.S. Pat. No. 5,604,782, issued on Feb. 18, 1997.

Figure 2:
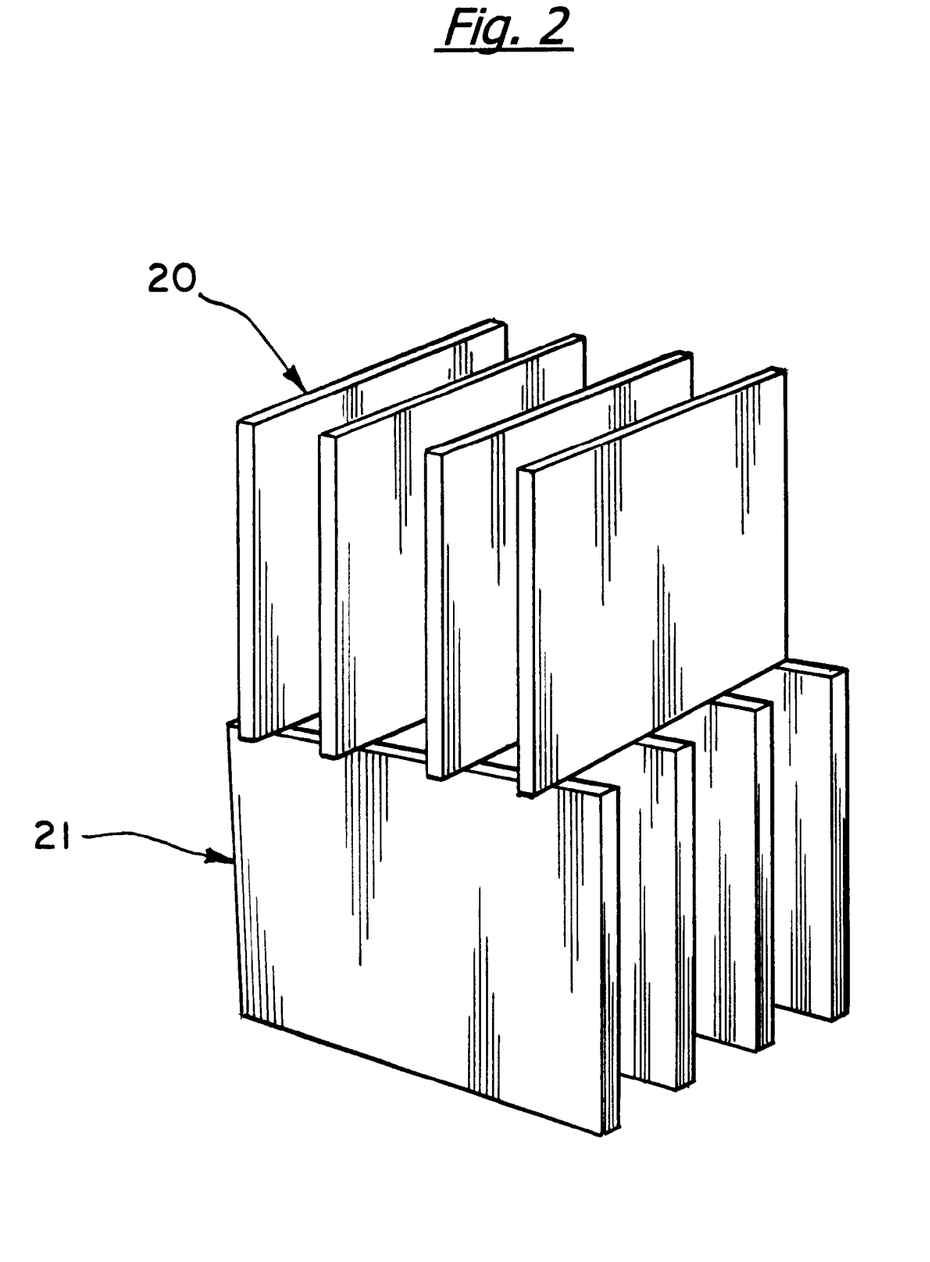
FIG. 2 is a perspective view of a multi-beam collimator using two orthogonal arrays of four mirrors each to create 16 apertures.

Each channel of the multi-channel design must be fairly small in order to contain enough signal to support the needed speed in the final beam. Thus, a large number of sub-beams (on the order of 100) must be assembled to achieve the one Watt of power which is the goal. To achieve this large number of channels without having to deal with almost a thousand mirrors, we use a criss-cross geometry in the preferred embodiment of the present invention, as shown in FIG. 2. By creating planes of pseudo-parallel mirrors, the number of apertures rises faster than the number of mirrors. For example, FIG. 2 shows a multi-channel design using two orthogonal arrays of mirrors 20, 21, each consisting of four mirror layers, to create sixteen apertures. Alternatively, if each mirror layer consists of ten mirrors, 100 collimated channels of radiation will result diverging from the source, each collimated as shown in the previous sections.

The collimator mirrors in each set 20, 21, 22, and 23 are arranged in a fan array (shown more clearly in FIG. 1) to receive photons at grazing incidence from the x-ray source 10. In other words, each channel gathers photons from a small solid angle of the x-ray source and produces a collimated beam. As a combined result, the multi-channel collimator produces a series of collimated beams similar to the quills on the back of a porcupine. Each of the beams is collimated, but the beams are radially divergent.

Figure 3A:
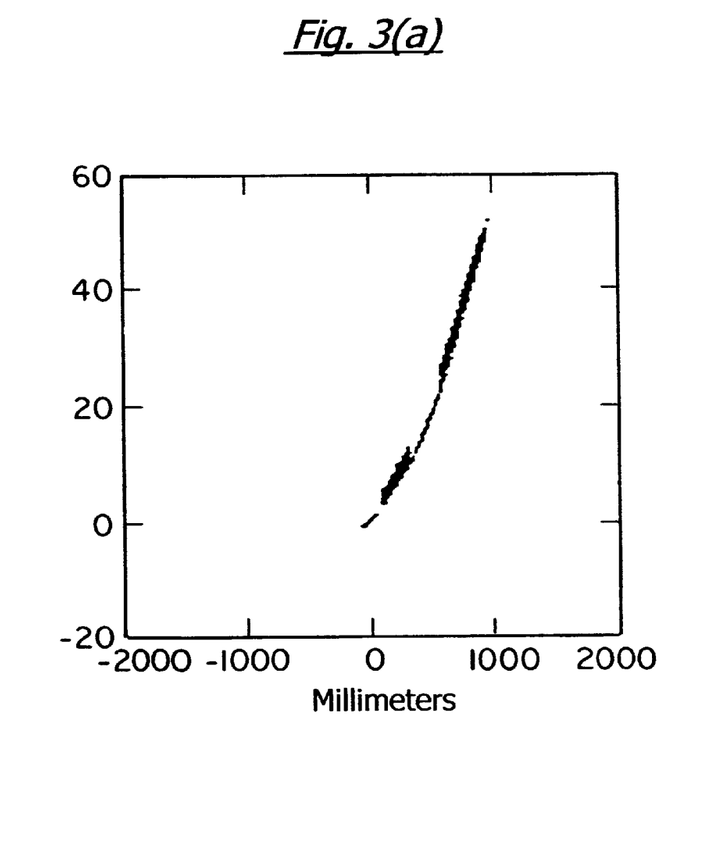
FIGS. 3(a) through 3(f) are spot plot diagrams showing the resulting beam distribution.
Figure 3B:
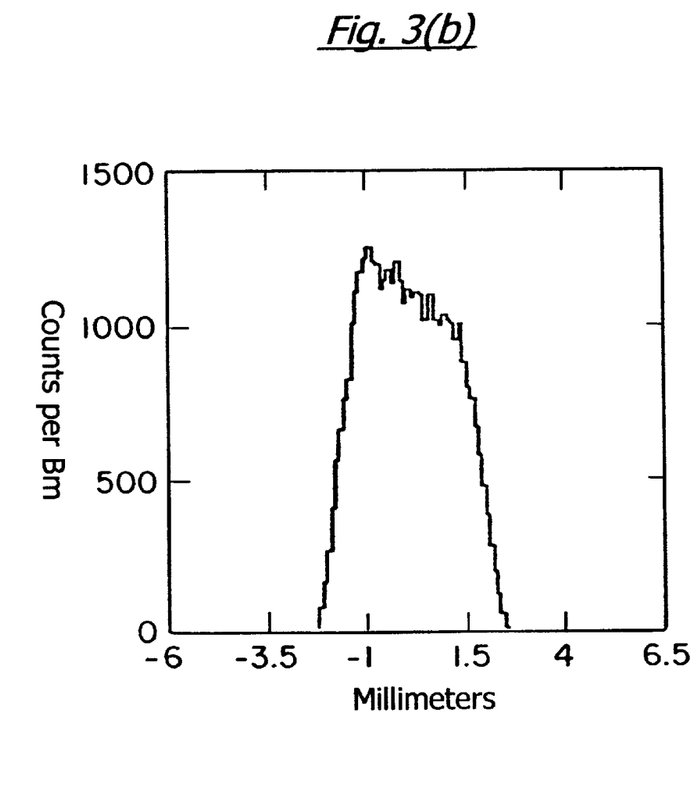
Figure 3C:
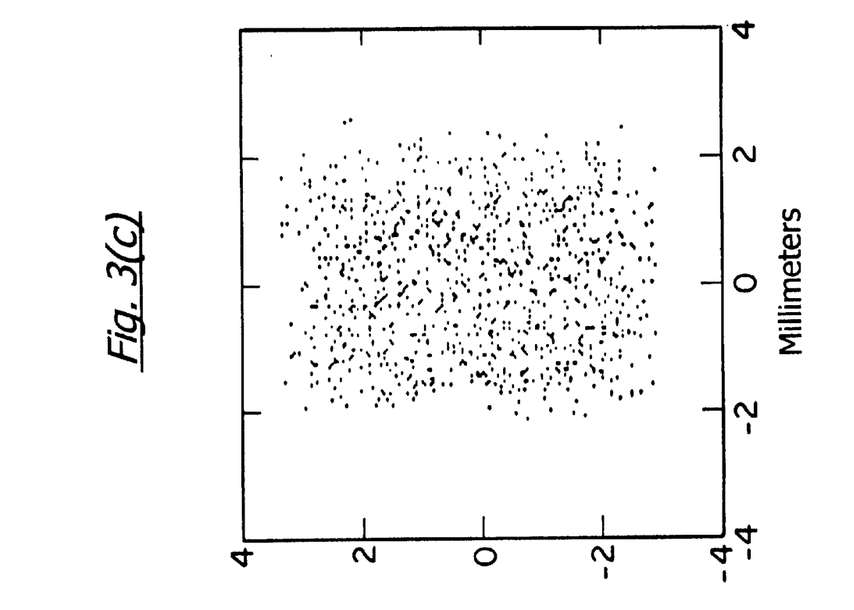
Figure 3D:
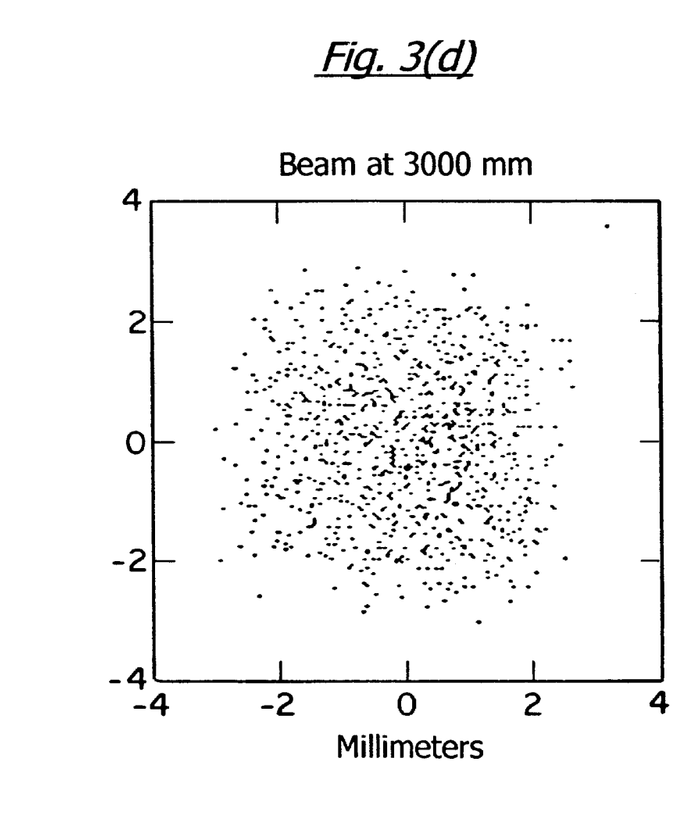
Figure 3E:
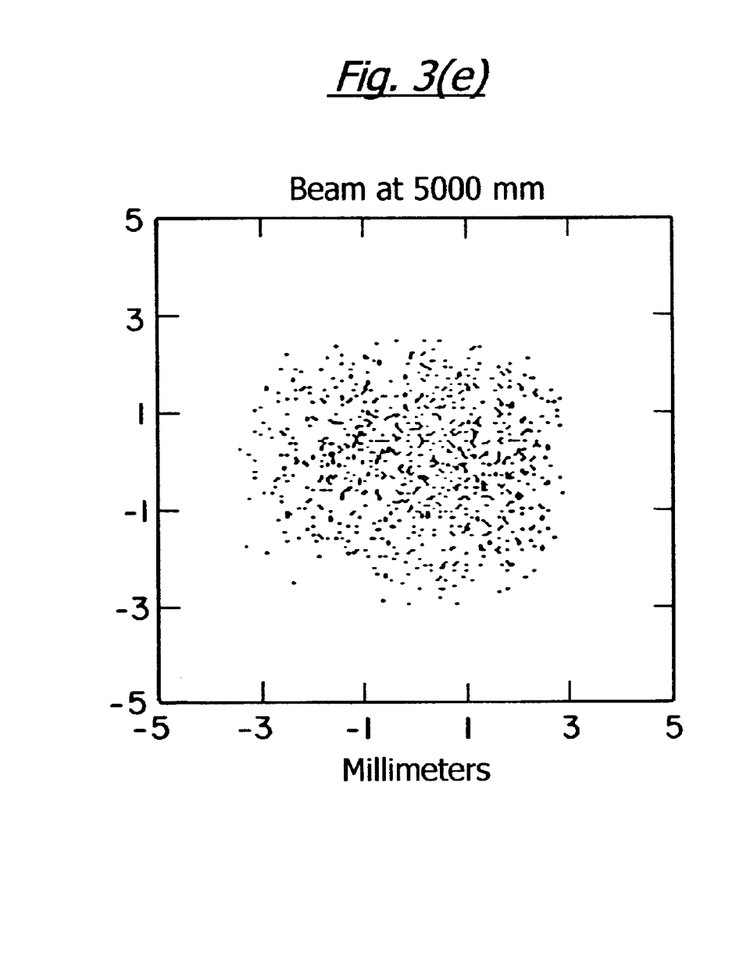
Figure 3F:
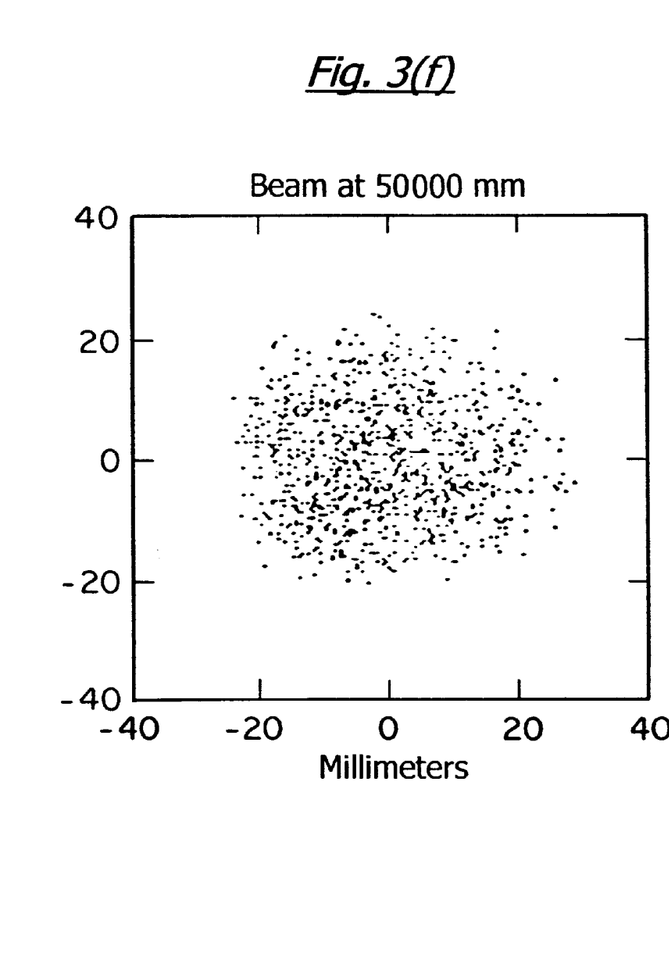
Figure 4A:
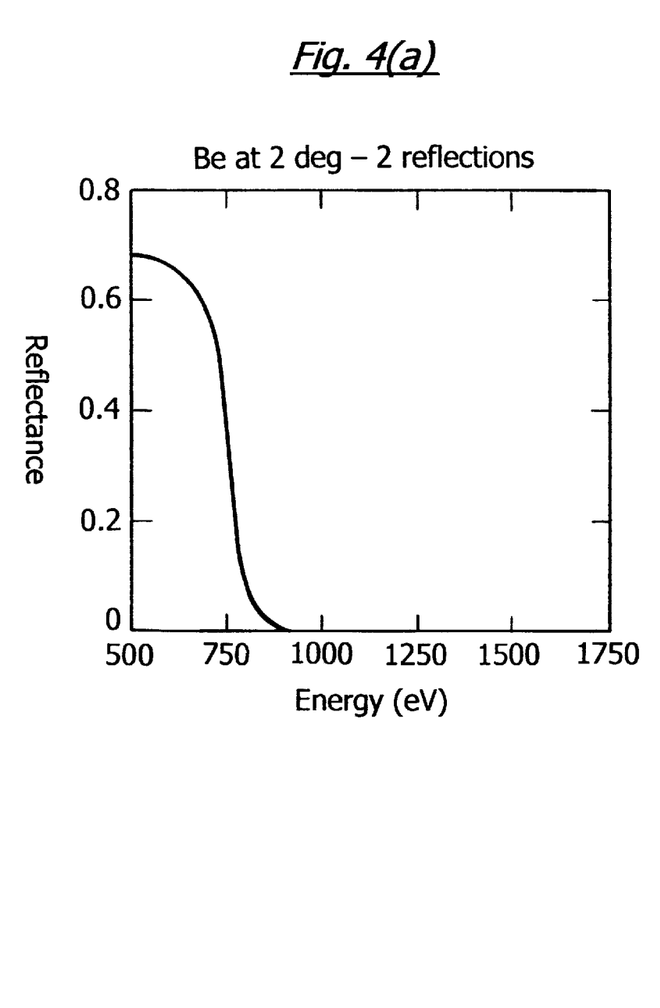
FIGS. 4(a) through 4(h) are graphs showing the reflection efficiency for various coatings.
Figure 4B:
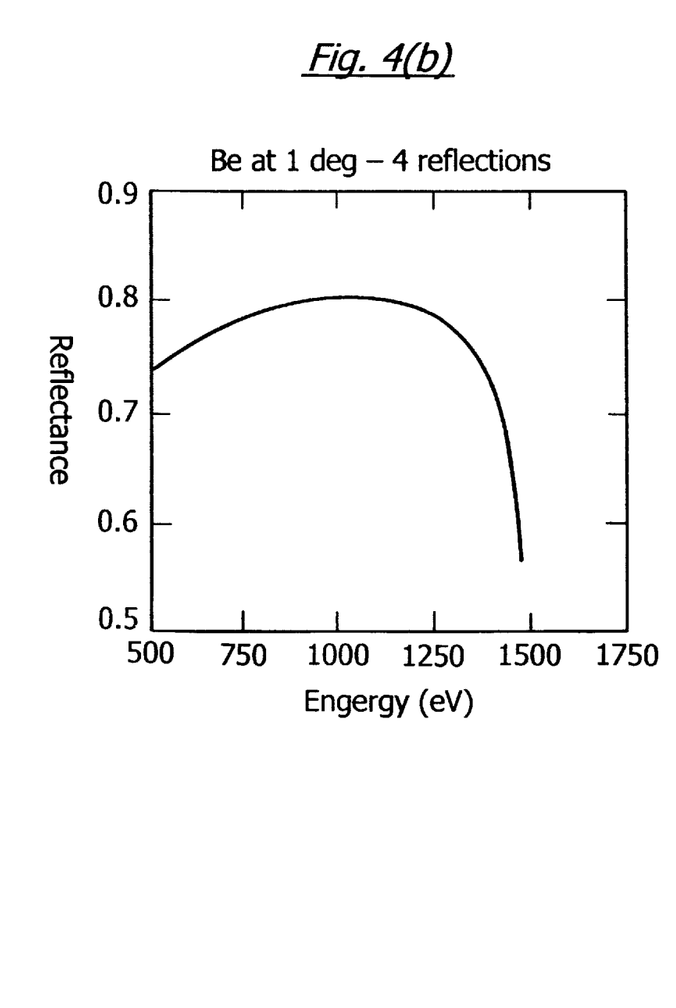
Figure 4C:
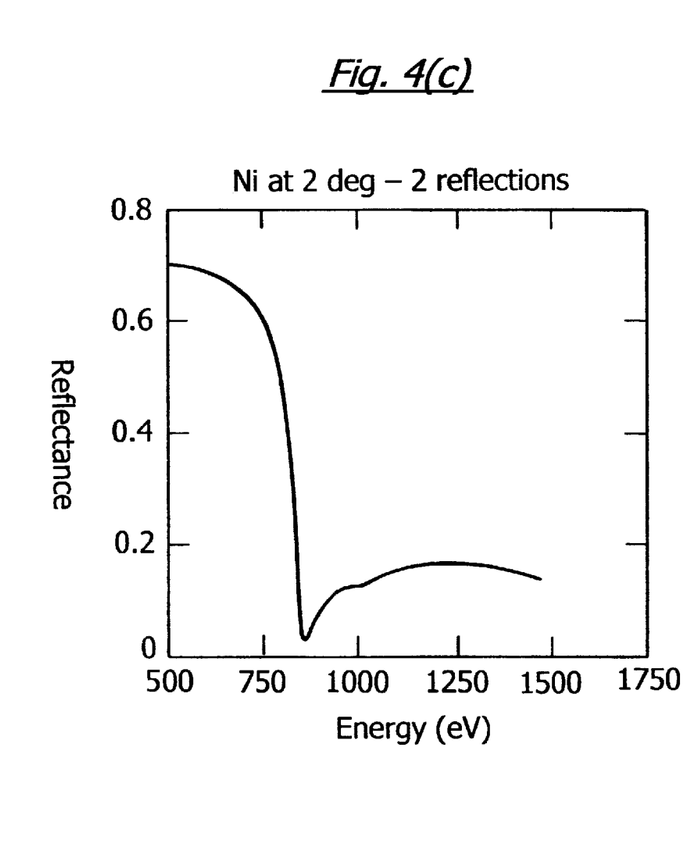
Figure 4D:
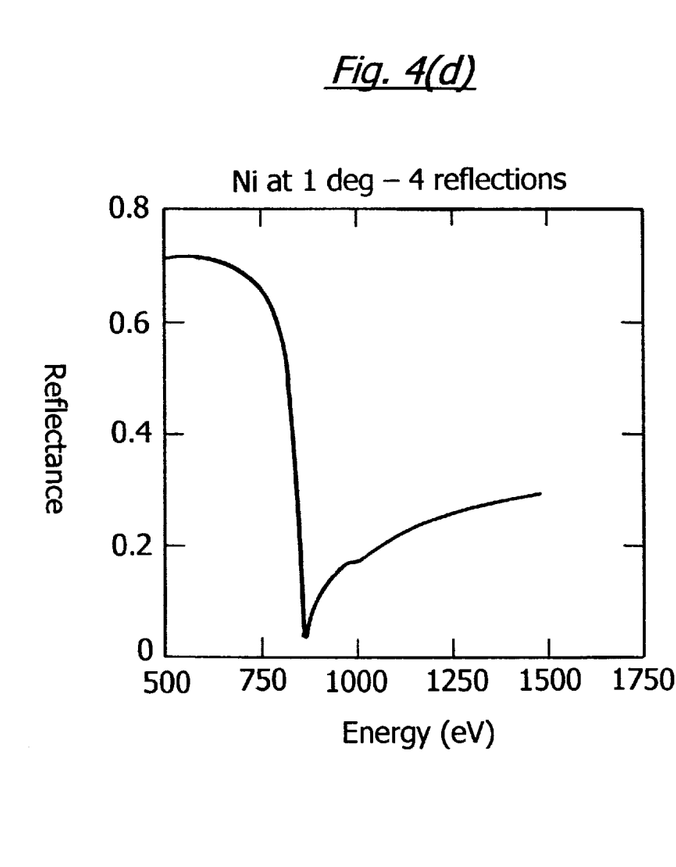
Figure 4E:
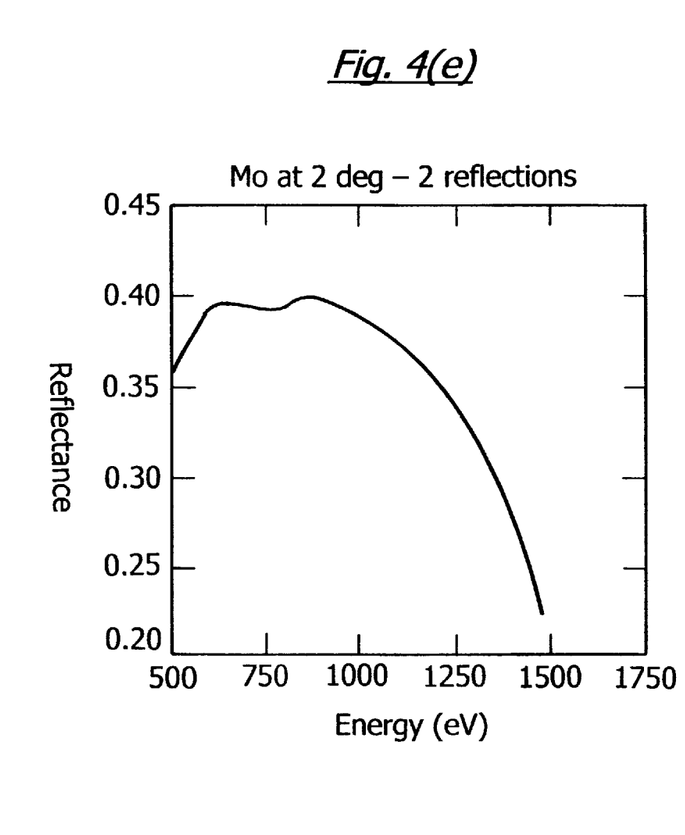
Figure 4F:
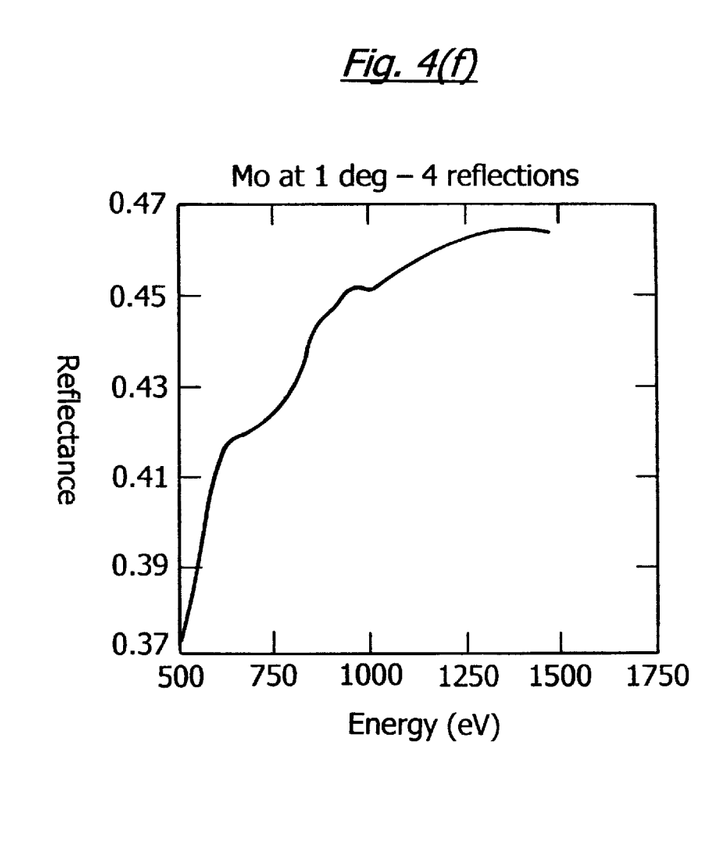
Figure 4G:
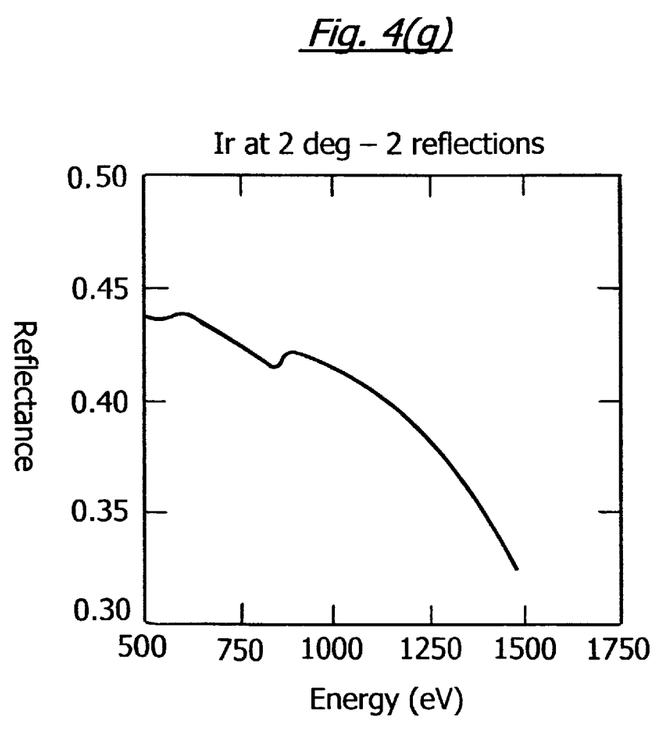
Figure 4H:
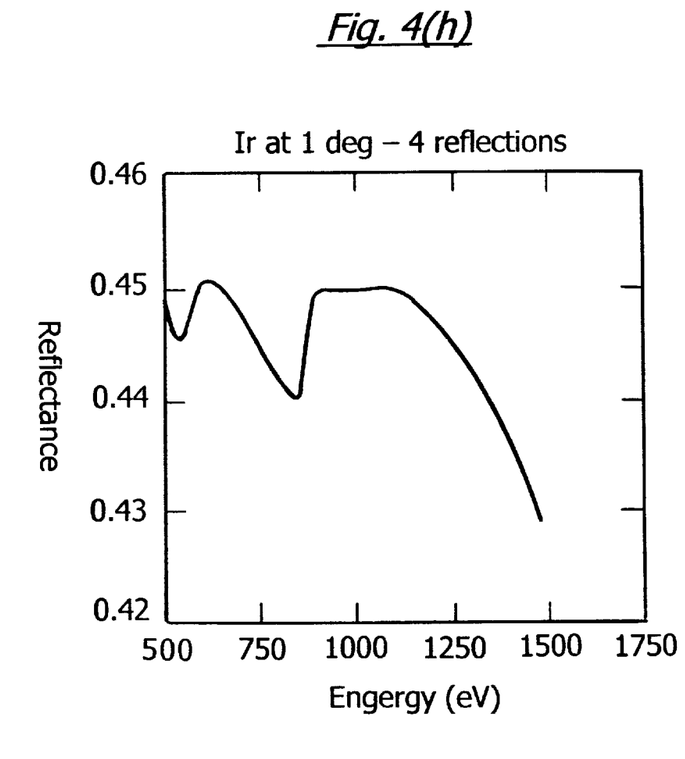

Appendix A presents the ray-trace code for a single channel of the multi-channel collimator. Note that we use a 0.5 mm diameter circle for the object in order to approximate the size source in the pinch. FIGS. 3(a) through 3(f) present some output from the ray-trace analysis of a single channel of the multi-channel collimator. FIG. 3(a) shows the distribution of the rays along the four mirrors. FIG. 3(b) is a histogram of beam brightness at a distance of 3 meters from the beam. One can see a variation of 15% across the beam. This effect is predictable and can be substantially reduced by a number of methods to keep it below 5% as desired. FIGS. 3(c) through 3(f) are spot plots that show the quality of the beam distribution. These spot plots confirm the parallel, uniform nature of the beam.

Beam Converger. The individual collimated beams produced by the first stage must be brought back together to form a single, collimated beam. Because the beams are now collimated, there is no longer concern about the distance from the source, or changing the divergence of the beam. We can assemble the sub-beams into a single beam using an array of flat mirrors 30–32 that steer the beams around past parallel to a slightly converging geometry, as shown in FIG. 1. These mirrors 30–32 can be arranged in the same crisscross manner and operate at grazing incidence.

Figure 5:
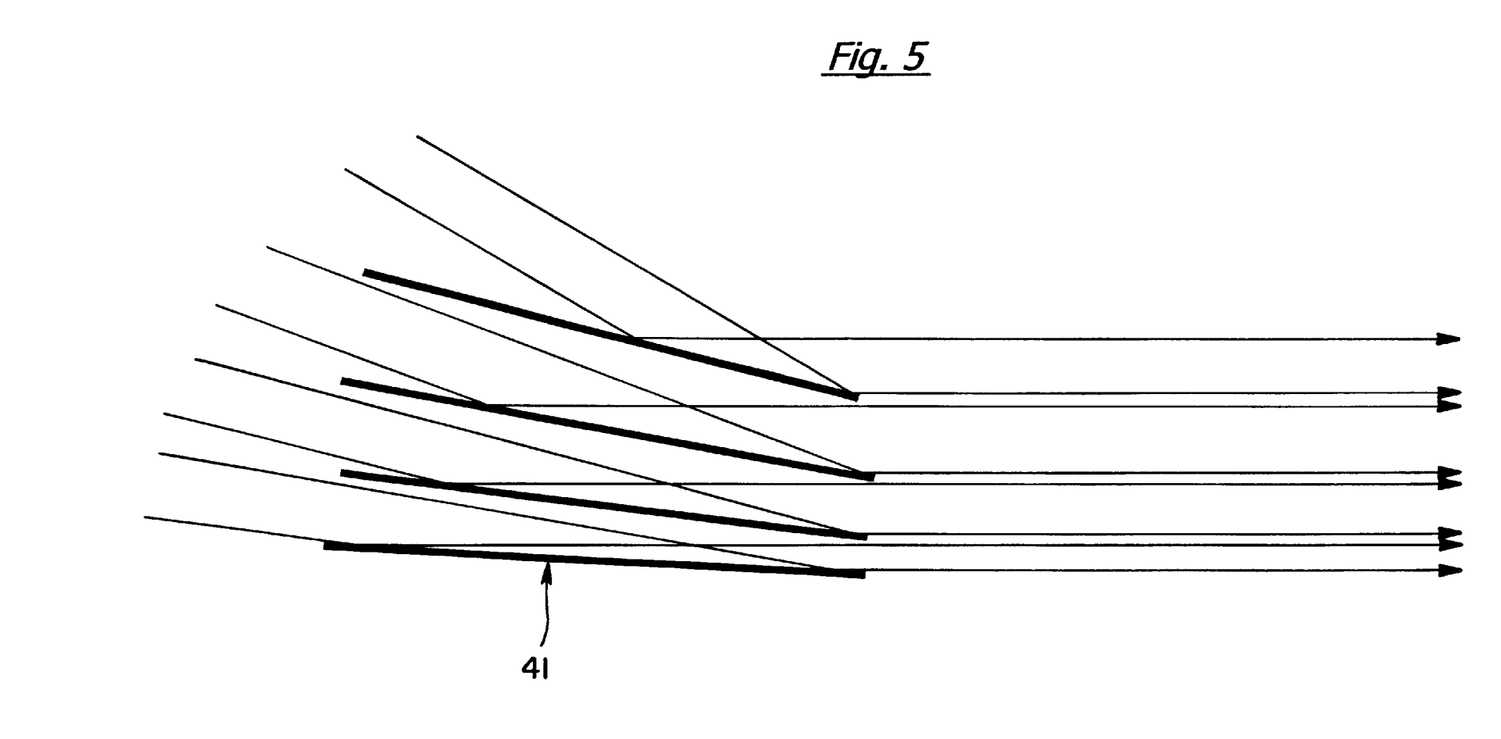
FIG. 5 is a simplified side view of an alternative embodiment using metal foil plates as the beam assembler.
Figure 6:
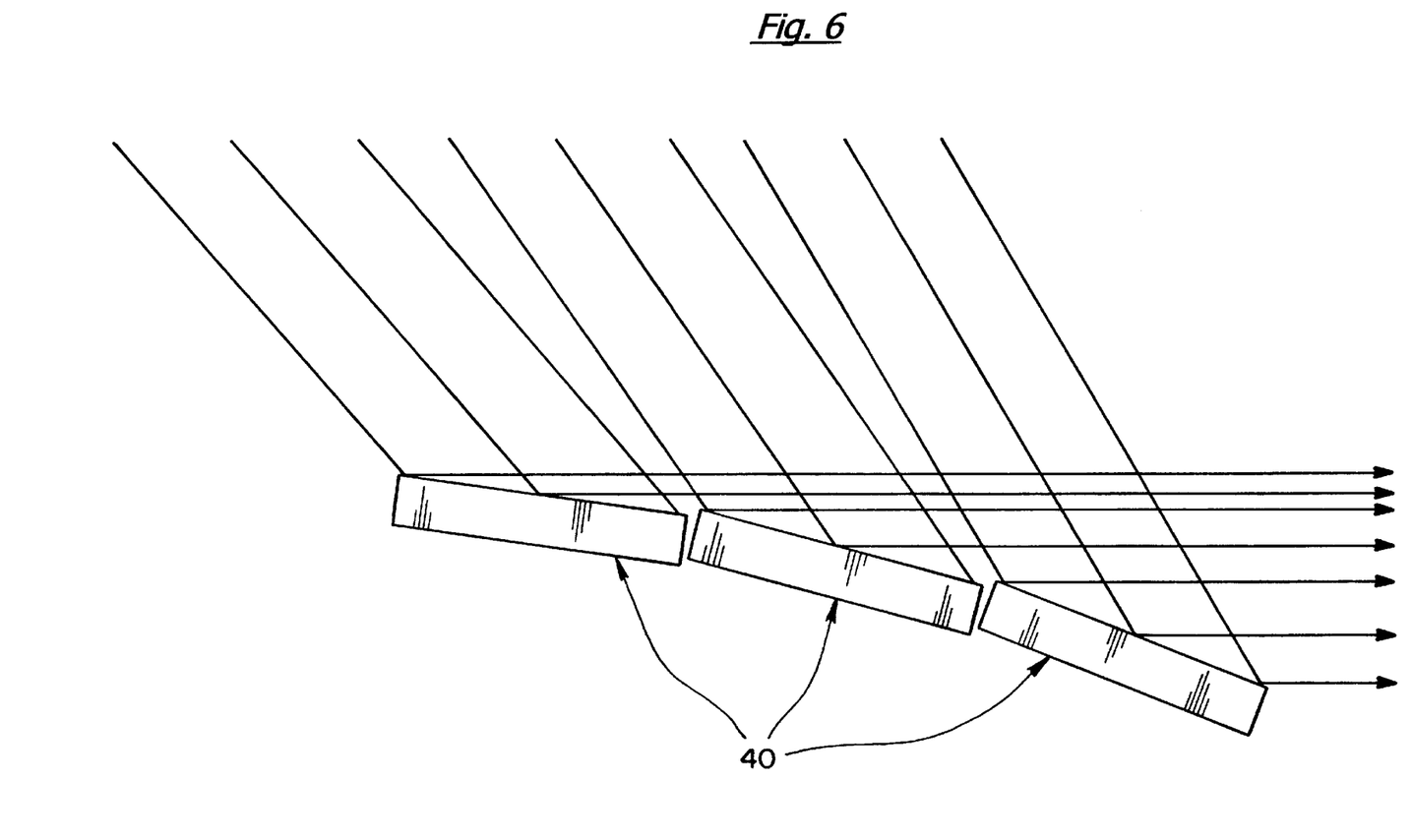
FIG. 6 is a simplified side view of the beam assembler 40 corresponding to FIG. 1.

Beam Assembler. When the beams are brought around to a converging geometry, they can be fed onto a series of reflective flat surfaces 40 arranged as shown in FIGS. 1 and 6 to assemble the final collimated beam. As an alternative, it is possible to use two arrays of metal foil flats 41 as shown in FIG. 5 to assemble the final collimated beam. The metal foils 41 must be quite thin to avoid significant loss of signal at the end points of the foils. With beam divergence of 0.002 radians at one meter, this means the beam will spread across 2 mm. To keep the edge effect down to 1% will require the foils be no more than 20 microns thick. This is a realistic requirement. Also, because the foils 41 are flat, they can easily be held to the needed optical tolerance by rigid frames outside the beam. Two such arrays are needed, one for each dimension.

Coatings. Coating simulations suggest that four coatings in particular are outstanding. Iridium is just slightly poorer than osmium, but is non-toxic. The second is molybdenum, the third nickel, and the fourth beryllium. FIGS. 4(a) through 4(h) show the graphs of the reflection efficiency needed to bend x-rays through eight degrees using two reflections of two degrees each, or four reflections of one degree for each coating. Other possible coatings include tungsten, gold, silicon carbide, and platinum.

From these graphs, beryllium is clearly the coating of choice as long as it is used below its critical angle. With one degree reflections, beryllium is very efficient. Indeed, using one degree reflections, one can bend 1.1 keV photons through 30 degrees before the total efficiency drops to below 50%. This is very important as it gives us access to the entire steradian of emission (100 Watts). Unfortunately, beryllium is subject to oxidation, reducing its reflectivity. Thus, thin overcoats, or a switch to another coating may be required.

Multilayer coatings can also be used to enhance performance of the optical system. One well known example is the multilayer coatings that are placed on eyeglasses to suppress internal reflection. Multilayer coatings have also proven very valuable in the x-ray band. The two major advantages to using multilayer coatings are use of higher reflection angles, and the possibility of spectral shaping of the beam. These two properties can greatly enhance performance or simplify design and fabrication in some, but not all, applications. The use of higher graze angles can significantly shorten a system. If the reflection angle is increased by some arbitrary factor, $\alpha$, the same aperture can be maintained with a mirror that is $\alpha$ times shorter. Also, if the beam is being steered through a large angle by using multiple reflections, the required number of reflections drops by a factor of $\alpha$. Thus the overall length savings can scale by as much as $\alpha^2$.

Since a multilayer coating can typically increase graze angle by a factor of three, length can be reduced by an order of magnitude. However, multilayer coatings also have some disadvantages, in that the range of incident angles is reduced, total system throughput is reduced, and fabrication is substantially complicated.

Multilayer coatings can be graded, wherein the thickness of the layers increases across an optic. This allows the mirror to be used in a diverging or converging beam. Multilayer coatings with thickness variations based on both position on the surface and depth in the layer are made commercially by Osmic, Inc of Troy Mich.

---

Appendix A

Raytrace code for a single channel of the multi-beam collimator

```
dr=3.1415927/180.
theta=1.
objcr,0.,.25,0.,0.,300.,1000,20.
pupsr, 2.,2.
;
rot,90.-theta,0,0
r1=1151.06
conic,0.,1.e8/r1
mirror
rot,-90.-theta,0,0
;
disp,0,0,-200.
rot,0,0,90.
rot,90.-theta,0,0
r3=652.896
conic,0.,1.e8/r3,-99
mirror
rot,-90.-theta,0,0
rot,0,0,-90.
;
disp,0,0,-250.
rot,90.-theta,0,0
r2=983.935
conic,0.,1.e8/r2,-99
mirror
rot,-90.-theta,0,0
;
disp,0,0,-300.
rot,0,0,90.
rot,90.-theta,0,0
r4=718.566
conic,0.,1.e8/r4,-99
mirror
rot,-90.-theta,0,0
rot,0,0,-90.
;
disp,0,0,-500.
;
flat
rot,0,0,90.
spot,1
end
```

---

I claim:

1. An apparatus for collimating x-ray radiation from a source comprising:

a collimator having a plurality of channels, with each channel having at least two pairs of orthogonal collimator mirrors with spherical surfaces, wherein rays from said source are reflected in grazing incidence in series by both of said spherical collimator mirrors in each pair to produce a substantially collimated beam;

an array of mirrors combining said collimated beams from said channels into a single collimated beam.

2. The apparatus of claim 1 wherein said collimator comprises:

a first array of collimator mirrors having spherical surfaces;

a second array of collimator mirrors having spherical surfaces, wherein said first array of collimator mirrors are orthogonal to said second array of collimator mirrors to provide a two-dimensional array of channels;

a third array of collimator mirrors having spherical surfaces; and a fourth array of collimator mirrors having spherical surfaces, wherein said third array of collimator mirrors are orthogonal to said fourth array of collimator mirrors to provide a two-dimensional array of channels.

3. The apparatus of claim 2 wherein said arrays of collimator mirrors are arranged as fan arrays.

4. The apparatus of claim 1 wherein said array of mirrors combining said collimated beams comprises:

a beam converger having an array of flat mirrors reflecting said collimated beams from said channels in grazing incidence to a converging geometry; and a beam assembler having an array of flat mirrors reflecting said converging beams in grazing incidence into a single collimated beam.

5. The apparatus of claim 4 wherein said beam converger comprises:

a first array of flat mirrors; and a second array of flat mirrors, wherein said first array of mirrors are orthogonal to said second array of mirrors to provide a two-dimensional array of apertures.

6. The apparatus of claim 4 wherein said beam assembler comprises two arrays of metal foil flats.

7. The apparatus of claim 1 wherein said mirrors further comprise a coating selected from the group consisting of iridium, molybdenum, osmium, tungsten, gold, silicon carbide, platinum, nickel and beryllium.

8. The apparatus of claim 7 wherein said coating has a thickness that is graded over the surface of said mirrors.

9. An apparatus for collimating x-ray radiation from a source comprising:

a multi-channel collimator having:

(a) a first array of collimator mirrors having spherical surfaces;

(b) a second array of collimator mirrors having spherical surfaces, wherein said first array of collimator mirrors are orthogonal to said second array of collimator mirrors to provide a two-dimensional array of channels;

(c) a third array of collimator mirrors having spherical surfaces;

(d) a fourth array of collimator mirrors having spherical surfaces, wherein said fourth array of collimator mirrors are orthogonal to said third array of collimator mirrors to provide a two-dimensional array of channels; and wherein rays entering a channel from said source are reflected in grazing incidence by one of said first array of collimator mirrors, one of said second array of collimator mirrors, one of said third array of collimator mirrors, and one of said fourth array of collimator mirrors to produce a substantially collimated beam from each channel;

a beam converger having an array of flat mirrors reflecting said collimated beams from said channels in grazing incidence to a converging geometry; and a beam assembler having an array of flat mirrors reflecting said converging beams in grazing incidence into a single collimated beam.

10. The apparatus of claim 9 wherein said mirrors further comprise a coating selected from the group consisting of iridium, molybdenum, osmium, tungsten, gold, silicon carbide, platinum, nickel and beryllium.

11. The apparatus of claim 10 wherein said coating has a thickness that is graded over the surface of said mirrors.

12. The apparatus of claim 9 wherein said arrays of collimator mirrors are arranged as fan arrays.

13. The apparatus of claim 9 wherein said beam converger comprises:

a first array of flat mirrors; and a second array of flat mirrors, wherein said first array of mirrors are orthogonal to said second array of mirrors to provide a two-dimensional array of apertures.

14. The apparatus of claim 9 wherein said beam assembler comprises two arrays of metal foil flats.

* * * * *